(12) United States Patent
Sakaue et al.

(10) Patent No.: US 8,448,050 B2
(45) Date of Patent: May 21, 2013

(54) MEMORY SYSTEM AND CONTROL METHOD FOR THE SAME

(75) Inventors: Kenji Sakaue, Kanagawa (JP);
Tatsuyuki Ishikawa, Kanagawa (JP);
Kazuhiro Ichikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 321 days.

(21) Appl. No.: 12/791,210

(22) Filed: Jun. 1, 2010

(65) Prior Publication Data

US 2011/0072331 A1 Mar. 24, 2011

(30) Foreign Application Priority Data

Sep. 18, 2009 (JP) ................................ 2009-218044

(51) Int. Cl.
*H03M 13/00* (2006.01)

(52) U.S. Cl.
USPC .......................................................... 714/785

(58) Field of Classification Search
USPC ................. 714/758, 763, 773, 755, 764, 765, 714/103, 30
See application file for complete search history.

(56) References Cited

U.S. PATENT DOCUMENTS

| 5,901,159 | A | * | 5/1999 | Ichikawa | 714/765 |
| 6,256,762 | B1 | * | 7/2001 | Beppu | 714/763 |
| 6,401,228 | B1 | * | 6/2002 | Ichikawa et al. | 714/755 |
| 2005/0262420 | A1 | | 11/2005 | Park et al. | |
| 2010/0122021 | A1 | * | 5/2010 | Lee et al. | 711/103 |
| 2010/0180154 | A1 | * | 7/2010 | Bellows | 714/30 |

FOREIGN PATENT DOCUMENTS

| JP | 2006-60296 | 3/2006 |
| JP | 2008-65969 | 3/2008 |
| KR | 10-0762619 | 9/2007 |

OTHER PUBLICATIONS

U.S. Appl. No. 13/039,961, filed Mar. 3, 2011, Sakaue, et al.
Office Action issued Aug. 30, 2011, in Japanese Patent Application No. 2009-218044.

* cited by examiner

*Primary Examiner* — Fritz Alphonse
(74) *Attorney, Agent, or Firm* — Oblon, Spivak, McClelland, Maier & Neustadt, L.L.P.

(57) ABSTRACT

A memory system having a memory card configured to store frame data composed of a plurality of pieces of sector data and a host configured to send and receive the frame data to and from the memory card, the memory card includes: an ECC1 decoder configured to perform BCH decoding processing with a hard decision code on a sector data basis; an ECC2 decoder configured to perform LDPC decoding processing with an LDPC code on a frame data basis; a sector error flag section configured to store information about presence or absence of error data in the BCH decoding processing; and an ECC control section configured to perform, in the LDPC decoding processing, control of increasing a reliability of sector data containing no error data based on the information in the sector error flag section.

18 Claims, 17 Drawing Sheets

FIG.1A
$$H = \begin{pmatrix} 1 & 2 & 3 & 4 & 5 & 6 \\ 1 & 1 & 1 & 0 & 0 & 0 \\ 0 & 0 & 1 & 1 & 0 & 0 \\ 0 & 0 & 0 & 1 & 1 & 1 \end{pmatrix} \begin{matrix} 1 \\ 2 \\ 3 \end{matrix}$$
FIG.1B
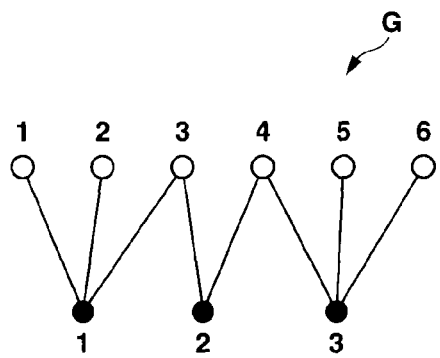
FIG.2A
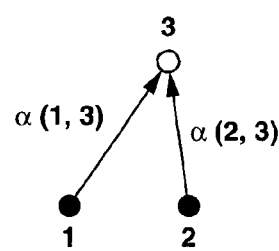
FIG.2B
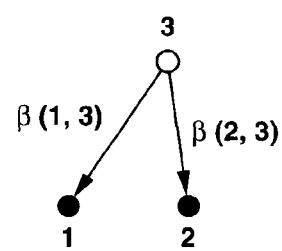
FIG.2C
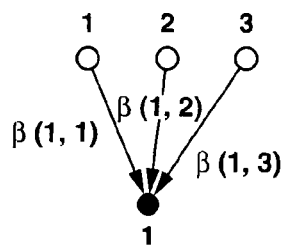
FIG.2D
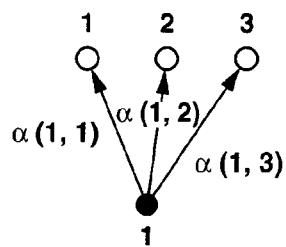

MEMORY SYSTEM AND CONTROL METHOD FOR THE SAME

CROSS-REFERENCE TO RELATED APPLICATIONS

This application claims the benefit of Japanese Application No. 2009-218044 filed in Japan on Sep. 18, 2009, the contents of which are incorporated herein by this reference.

BACKGROUND OF THE INVENTION

1. Field of the Invention

The present invention relates to a memory system and a control method for the same, and more particularly to a memory system with an error correction section employing algebra-based error correcting codes and error correcting codes using probability-based repeated calculations, and a control method for the same.

2. Description of the Related Art

In the semiconductor memory field, developments regarding error correcting codes are actively pursued. Among the error correcting codes, a particular focus of attention in recent years is low density parity check codes (hereinafter referred to as "LDPC codes"), which are error correcting codes using probability-based repeated calculations. For LDPC codes, excellent performance approaching a Shannon limit, which is a theoretical limit of code performance, has been reported.

In algebra-based error correction schemes using hard decision codes such as BCH codes and Reed-Solomon (RS) codes that have been widely in practical use, increasing the rate of correctable bit errors involves problems such as an increase in size of a parity portion or a correction circuit. However, the ability of these schemes to reliably correct a certain number of errors or less has been mathematically demonstrated.

On the other hand, for the LDPC codes, which is an error correcting scheme using probability-based repeated calculations, it is difficult to clearly define the correction ability itself of the codes. Error correction may occasionally fail even for a rather few bit errors.

As such, error correction schemes employing a concatenated code using both an LDPC code and a BCH code are known. For example, Ordinance for Standard Transmission Systems for Digital Broadcasting among Standard Television Broadcasting, Etc., Appended Table 39, Error Correction Scheme for Advanced Narrow-band Transmission Digital Broadcasting (related to Article 49, Section 3), based on specifications in Radio Law (Law No. 131 of 1950), Article 38, defines an error correction scheme employing a concatenated code using a BCH code as an outer code and an LDPC code as an inner code.

However, since decoding processing with the LDPC codes is performed by repeating an iteration process as described later, a large number of iteration processes may be performed. This increases the decoding processing time and also increases the power consumption required for the decoding processing.

Furthermore, in an error check and correction (hereinafter referred to as "ECC") circuit using the LDPC codes, the processing time increases in proportion to the code length. At the same time, not only an iteration process circuit but also a parity check circuit increases in size.

Here, Japanese Patent Application Laid-Open Publication No. 2008-219528 proposes an ECC circuit that omits iteration processes for data having a reliability exceeding a predetermined value. However, in this ECC circuit, the circuit size increases because parallel processing of operations requires a plurality of threshold determination circuits for bit node reliability. For example, in a scheme using a regular-type parity check matrix of a 256×256 unit matrix, parallel processing of operations of 256 bit nodes in 256 operation units requires a threshold determination circuit (e.g., a magnitude comparator) for each of all operation units. Therefore, the circuit size significantly increases.

Furthermore, in the above ECC circuit, when the number of iteration processes exceeds a predetermined maximum number of iterations and it is found that the error correction does not converge, the iteration process is again performed by including data having a reliability exceeding the threshold. For example, if the maximum number of iterations is eight, the iteration process is again performed after eight iteration processes are finished, and therefore the processing speed may decrease.

BRIEF SUMMARY OF THE INVENTION

A memory system in an aspect of the present invention of this application is a memory system having a storage apparatus configured to store coded frame data resulting from encoding frame data composed of a plurality of pieces of sector data and a host configured to send and receive the frame data to and from the storage apparatus, the storage apparatus including: a first ECC decoder configured to perform hard decision code decoding processing with a hard decision code on a sector data basis; a second ECC decoder configured to perform LDPC decoding processing with an LDPC code on a frame data basis; a sector error flag section configured to set, for each sector, a sector error flag that stores information about presence or absence of error data in the hard decision code decoding processing; and an ECC control section configured to perform, in the LDPC decoding processing, control of increasing a reliability of sector data containing no error data based on the information in the sector error flag section.

A control method for a memory system according to another aspect of the present invention of this application includes: performing CRC encoding in which CRC parity of each of a plurality of pieces of sector data constituting frame data is generated and added; performing hard decision encoding in which hard decision code parity of each of the pieces of sector data is generated and added; performing LDPC encoding in which LDPC parity of the frame data including the CRC parity and the hard decision code parity is generated to produce coded frame data; storing the coded frame data in a NAND memory section; reading the coded frame data from the NAND memory section; performing CRC error detection in which presence or absence of an error in each of the pieces of sector data is detected from the CRC parity of each of the pieces of sector data constituting the coded frame data; performing hard decision code decoding in which error correction is performed using the hard decision code parity of each of the pieces of sector data constituting the coded frame data; setting a sector error flag for identifying the sector data found to contain an error in the CRC error detection or the hard decision code decoding; performing LLR change in which a reliability of the sector data containing no error data is increased when the coded frame data is subjected to decoding processing with the LDPC parity; and performing the LDPC decoding processing.

BRIEF DESCRIPTION OF THE DRAWINGS

FIGS. 1A and 1B are diagrams for describing repetitive decoding in an LDPC code;

FIGS. 2A to 2D are diagrams showing parts of a Tanner graph G;

DETAILED DESCRIPTION OF THE INVENTION

Hereinafter, embodiments of the present invention will be described with reference to the drawings.

<About LDPC Code>

First, using FIGS. 1A to 2D, repetitive decoding in an LDPC code will be briefly described. FIGS. 1A and 1B are diagrams for describing repetitive decoding in an LDPC code, where FIG. 1A shows an exemplary parity check matrix H and FIG. 1B is a Tanner graph G corresponding to the parity check matrix H. FIGS. 2A to 2D are diagrams showing parts of the Tanner graph G.

As shown in FIGS. 1A and 1B, understanding the repetitive decoding in an LDPC code is facilitated by the use of a Tanner graph, which is a bipartite graph, corresponding to the parity check matrix H. In FIGS. 1A and 1B, nodes of the Tanner graph G are classified into two types: variable nodes and check nodes. The variable nodes correspond to columns of the matrix H, and the check nodes correspond to rows of the matrix H. Nodes "1" in elements of the matrix H are connected by edges to construct the Tanner graph G.

Decoding processing of the LDPC code is performed by repeatedly updating, at the nodes, log likelihood ratio information assigned to the edges of the Tanner graph. The log likelihood ratio information includes two types of information: log likelihood ratio information from a check node to a variable node (hereinafter denoted by a symbol "$\alpha$") and log likelihood ratio information from a variable node to a check node (hereinafter denoted by a symbol "$\beta$"). In the decoding processing of the LDPC code, a process of performing variable node processing (row processing) once and check node processing (column processing) once is called one iteration process, and the decoding processing is performed by repeating the iteration process.

Known algorithms for updating the log likelihood ratio information at the variable nodes and the check nodes, namely, message-passing algorithms, include methods such as the sum-product algorithm and the min-sum algorithm. Here, the min-sum algorithm, which has relatively small computational complexity, will be described as an algorithm for updating the log likelihood ratio information.

First, using FIGS. 2A and 2B, the variable node processing will be described. FIGS. 2A and 2B are diagrams in which a part related to a variable node 3 in the Tanner graph of FIG. 1B is extracted.

A log likelihood ratio (hereinafter referred to as an "LLR" and denoted by a symbol "$\lambda$") on reception of a codeword bit corresponding to a variable node, for example the variable node 3, is expressed as $\lambda(3)$. The log likelihood ratio information from a check node to the variable node 3 is expressed as $\alpha(j, 3)$, where j denotes the node number of the check node connecting to the variable node 3 and corresponds to "1" and "2" in the Tanner graph G shown in FIG. 1B.

Figure 3:
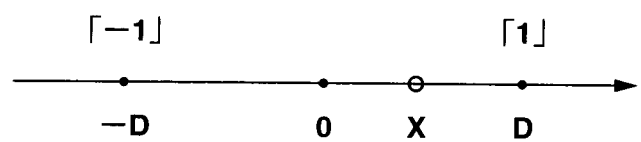
FIG. 3 is an illustrative diagram for describing a log likelihood ratio.

Here, using FIG. 3, the log likelihood ratio (LLR) will be described. As shown in FIG. 3, a mapping point corresponding to a bit "0" is "D" and a mapping point corresponding to a bit "1" is "−D" on a number line. When received data is located at "X," the log likelihood ratio $\lambda$ is calculated with the following equation.

$$\lambda = -(D-X)^2 + (-D-X)^2$$

However, an upper limit value Mx is set for the absolute value of the log likelihood ratio $\lambda$. That is, if $|\lambda| \geq Mx$, clipping processing is performed so that $|\lambda| = Mx$.

Here, the absolute value $|\lambda|$ of the log likelihood ratio $\lambda$ is called a reliability. A reliability closer to Mx means a higher reliability, whereas a reliability closer to 0 means a lower reliability.

The variable node 3 performs a calculation expressed as Equation 1 below for a check node of an edge corresponding to $\alpha(1, 3)$, that is, a check node 1.

$$\beta(3,1) = \lambda(3) + \alpha(2,3) \quad \text{(Equation 1)}$$

Similarly, a calculation expressed as Equation 2 below is performed for a check node with a node number j, where $\Sigma$ means the sum across check nodes connecting to the variable node 3 except k=j.

$$\beta(3,j) = \lambda(3) + \Sigma \alpha(k,3) \quad \text{(Equation 2)}$$

The above calculation is performed for all variable nodes to calculate $\beta(i, j)$ expressed as Equation 3 below. Note that i=1 to N, where N is the code length and i is the node number. $\Sigma$ means the sum across check nodes connecting to the variable node i except k=j.

$$\beta(i,j) = \lambda(i) + \Sigma \alpha(k,i) \quad \text{(Equation 3)}$$

Next, using FIGS. 2C and 2D, the check node processing will be described. FIGS. 2C and 2D are diagrams in which a part related to the check node 1 in the Tanner graph of FIG. 1B is extracted.

Where the log likelihood ratio information as a message to a check node, for example the check node 1, is expressed as $\beta(k, 1)$, this check node calculates $\alpha(1, 1)$ expressed as Equation 4 below for the variable node 1, which is a variable node of an edge corresponding to $\beta(1, 1)$, where k is the node number of a variable node connected to this check node 1 and corresponds to "1," "2," and "3" in the example of FIG. 1B.

Also, m is selected from "2" to "3." Here, sign (Πβ(m, 1)) means the sign ("+1" or "−1") of the result of multiplying β(m, 1) from m=2 to m=3. Also, |β(m, 1)| is the absolute value of β(m, 1), and min is a function for selecting the minimum of a plurality of |β(m, 1)|.

$$\alpha(1,1)=\text{sign}(\Pi\beta(m,1))\times\min(|\beta(m,1)|) \quad \text{(Equation 4)}$$

Similarly, Equation 5 below is used to calculate α(1,i), where i is the node number of a variable node connected to the check node 1 and corresponds to "1," "2," and "3" in the example of the Tanner graph of FIG. 1B. Also, m is a variable node connecting to the check node 1 except m=i.

$$\alpha(1,i)=\text{sign}(\Pi\beta(m,1))\times\min\{|\beta(m,1)|\} \quad \text{(Equation 5)}$$

The above calculation is performed for all check nodes to calculate α(j, i) with Equation 6 below, where m is a variable node connecting to the check node j except m=i.

$$\alpha(j,i)=\text{sign}(\Pi\beta(m,j))\times\min(|\beta(m,j)|) \quad \text{(Equation 6)}$$

In the repetitive decoding, a posterior probability Pb(i) (log posterior probability ratio: Ln), which is an LLR after an iteration process, is determined with Equation 7 below in each iteration process in which the above variable node processing and check node processing are each performed once, where i=1 to N, and N is the code length. Σ is the sum across all check nodes connected to a variable node i.

$$Pb(i)=\lambda(i)+\Sigma\alpha(k,i) \quad \text{(Equation 7)}$$

Based on this posterior probability value Pb, bit determination is performed, that is, whether the bit in question is "0" or "1" is determined. This hard decision result is used to perform parity check of the LDPC code, and when the absence of errors is confirmed, the repetitive processing is finished. This is the repetitive decoding method of the LDPC code.

First Embodiment

Now, a memory system 1 and a control method for the memory system 1 in a first embodiment of the present invention will be described.

Figure 4:
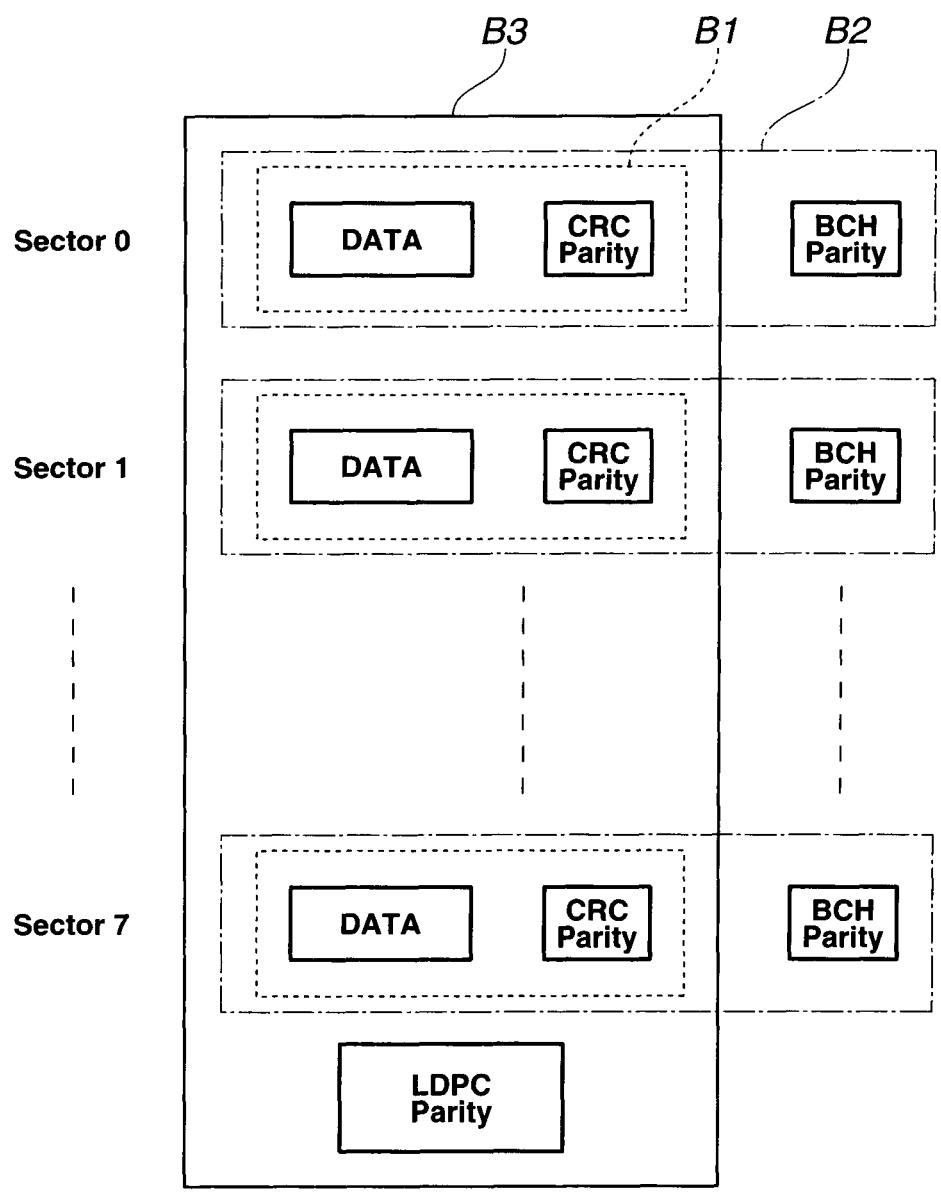
FIG. 4 is a diagram for describing a data hierarchy structure and error check/correction ranges of ECC1 and ECC2.

As shown in FIG. 4, when data is stored, the memory system 1 in the present embodiment divides LDPC frame data (cluster) into subframe data (sectors) to encode the data in a BCH/CRC scheme (ECC1) on a sector basis, and further encode the data in an LDPC scheme (ECC2) on a cluster basis. The frame data is divided into, for example, eight 512-byte sectors from a sector 0 to a sector 7. CRC parity and BCH parity are added to each sector, and LDPC parity is further added to the frame data.

In the CRC parity generation in the ECC1, 4-byte CRC parity is generated by encoding the 512-byte sector data with a generator polynomial. In the BCH parity generation in the ECC1, 5-byte BCH parity is generated for 516 bytes (512-byte sector data+CRC parity) in the case of performing encoding capable of 3-bit correction.

In the LDPC parity generation in the ECC2, 320-byte LDPC parity is generated by encoding the (sector data+CRC parity of eight sectors) in the LDPC scheme. In FIG. 4, B1 denotes an error check range for the CRC parity, B2 denotes an error check and correction range for the BCH parity, and B3 denotes an error check range for the LDPC parity. Although the LDPC encoding does not include the BCH parity in the example shown in FIG. 4, the LDPC encoding may include the BCH parity.

When coded data is read and decoded, the memory system 1 first performs BCH/CRC-based error check and correction processing (ECC1) on a sector basis, and then performs LDPC-based error check and correction processing (ECC2) on a cluster basis. In the ECC2, the reliability of a sector identified as errorless in the ECC1 is increased, or specifically the reliability is set to the maximum, and the iteration process for the sector is skipped.

Figure 5:
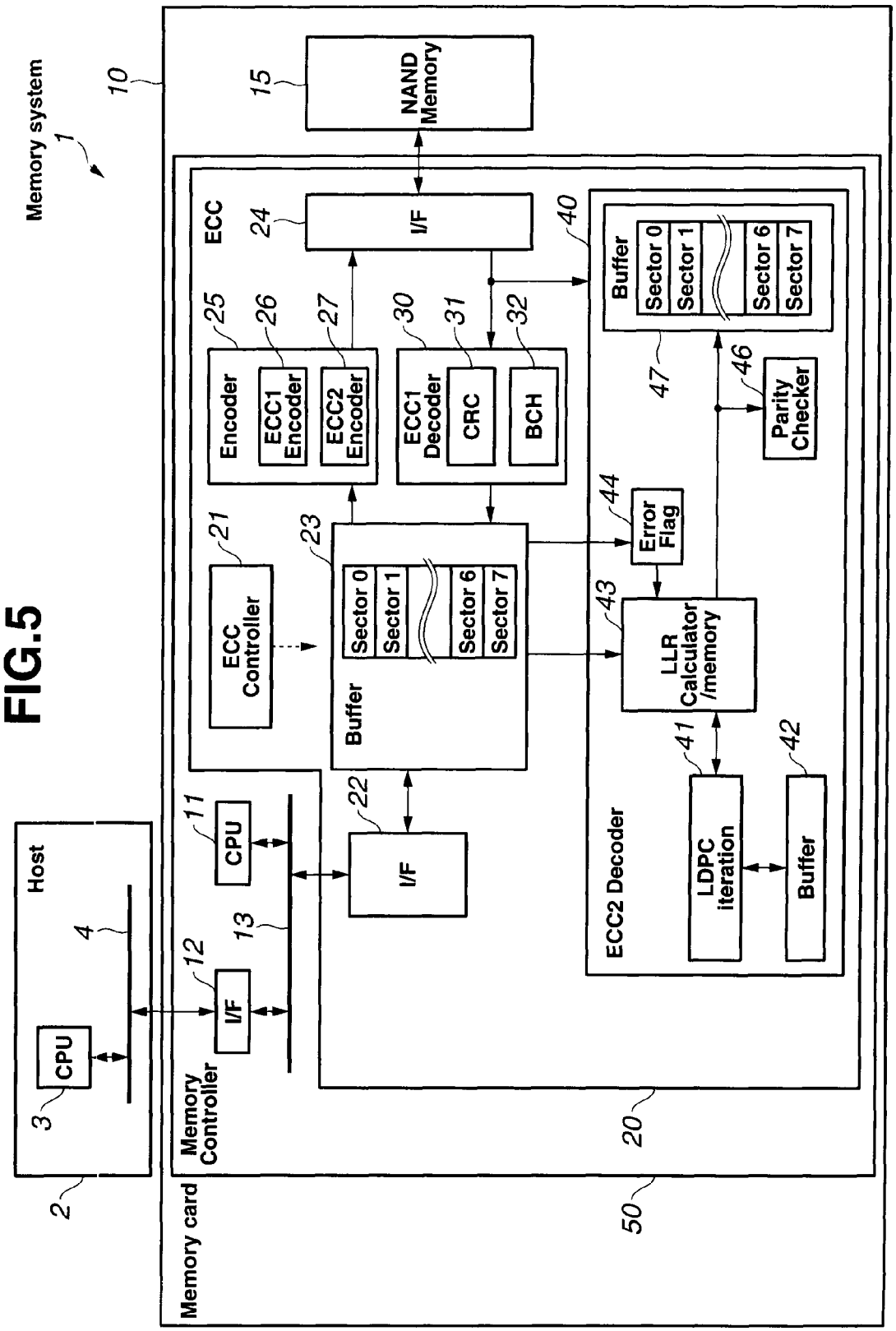
FIG. 5 is a configuration diagram showing a configuration of a memory system in a first embodiment.

Now, using FIG. 5, a configuration of the memory system 1 will be described. As shown in FIG. 5, the memory system 1 has a host 2 such as a personal computer or a digital camera, and a memory card 10 that is a storage apparatus detachably connected with the host 2. The host 2 sends and receives data to and from the memory card 10 through the control of a CPU 3 over various function sections (not shown) connected via a bus 4.

The memory system may have a host and what is called an embedded-type storage apparatus accommodated inside the host and configured to store startup data for the host and the like, and the storage apparatus may be in a form such as a semiconductor disk: SSD (Solid State Drive). Alternatively, the memory system may function as a mobile music player into which a storage apparatus corresponding to the memory card 10 and a host are integrated.

As shown in FIG. 5, the memory card 10, which is a storage apparatus, has a NAND memory section 15 and a memory controller 50. The NAND memory section 15 is a flash memory section and has a structure in which many memory cells, which are unit cells, are connected such as via bit lines used for writing and word lines used for reading.

The memory controller 50 has a CPU 11, an interface 12, and an error check and correction section (ECC section) 20, connected via a bus 13. The CPU 11 controls various function sections and the like (not shown) connected via the bus 13 and thereby sends and receives data to and from the host 2 via the interface 12 and also to and from the NAND memory section 15.

Under the control of an ECC control section 21, the ECC section 20 sends and receives data to and from the bus 13 via an interface 22 and to and from the NAND memory section 15 via an interface 24, in addition to performing encoding processing and decoding processing to be described later.

As shown in FIG. 5, the ECC section 20 has an encoder 25, an ECC1 decoder (first ECC decoder) 30, an ECC2 decoder (second ECC decoder) 40, and a buffer 23. The encoder 25 has an ECC1 encoder (first ECC encoder) 26 employing algebra-based error correction schemes, and an ECC2 encoder (second ECC encoder) 27 employing an error correction scheme using a probability-based repeated calculations. The ECC1 decoder 30 has a CRC syndrome calculation circuit 31 and a BCH decoder 32. The ECC2 decoder 40 has an LDPC iteration process circuit 41, a buffer 42 as an intermediate-value memory, an LLR calculation/storage section 43 configured to calculate and store an LLR (log posterior probability ratio Ln), a sector error flag (EF) section 44 configured to set and store sector error flags, a buffer 47 as data memory, a CRC syndrome calculation circuit 45, and a parity check circuit 46.

Figure 6:
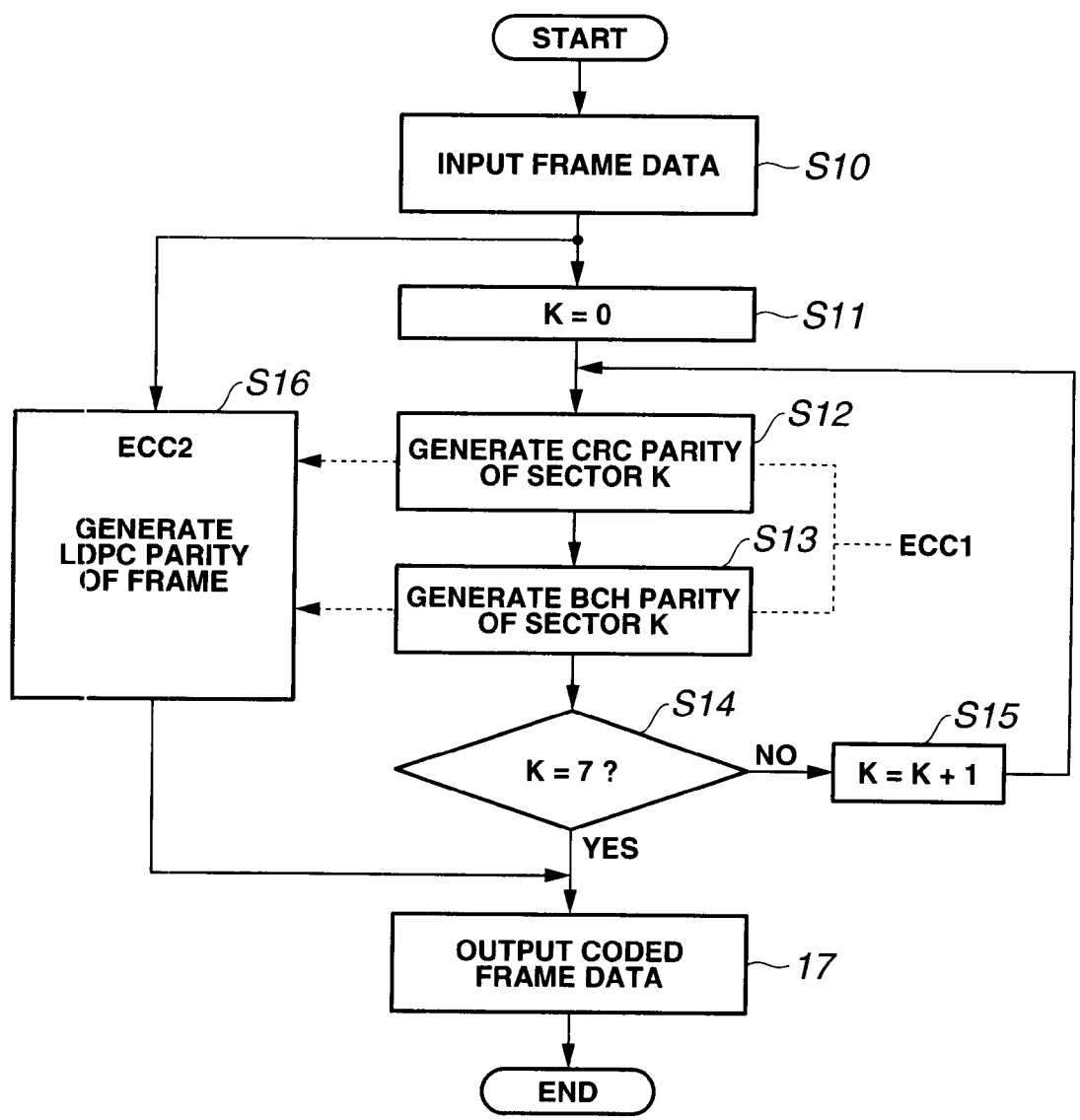
FIG. 6 is a flowchart showing a flow of encoding processing in the memory system in the first embodiment.
Figure 7:
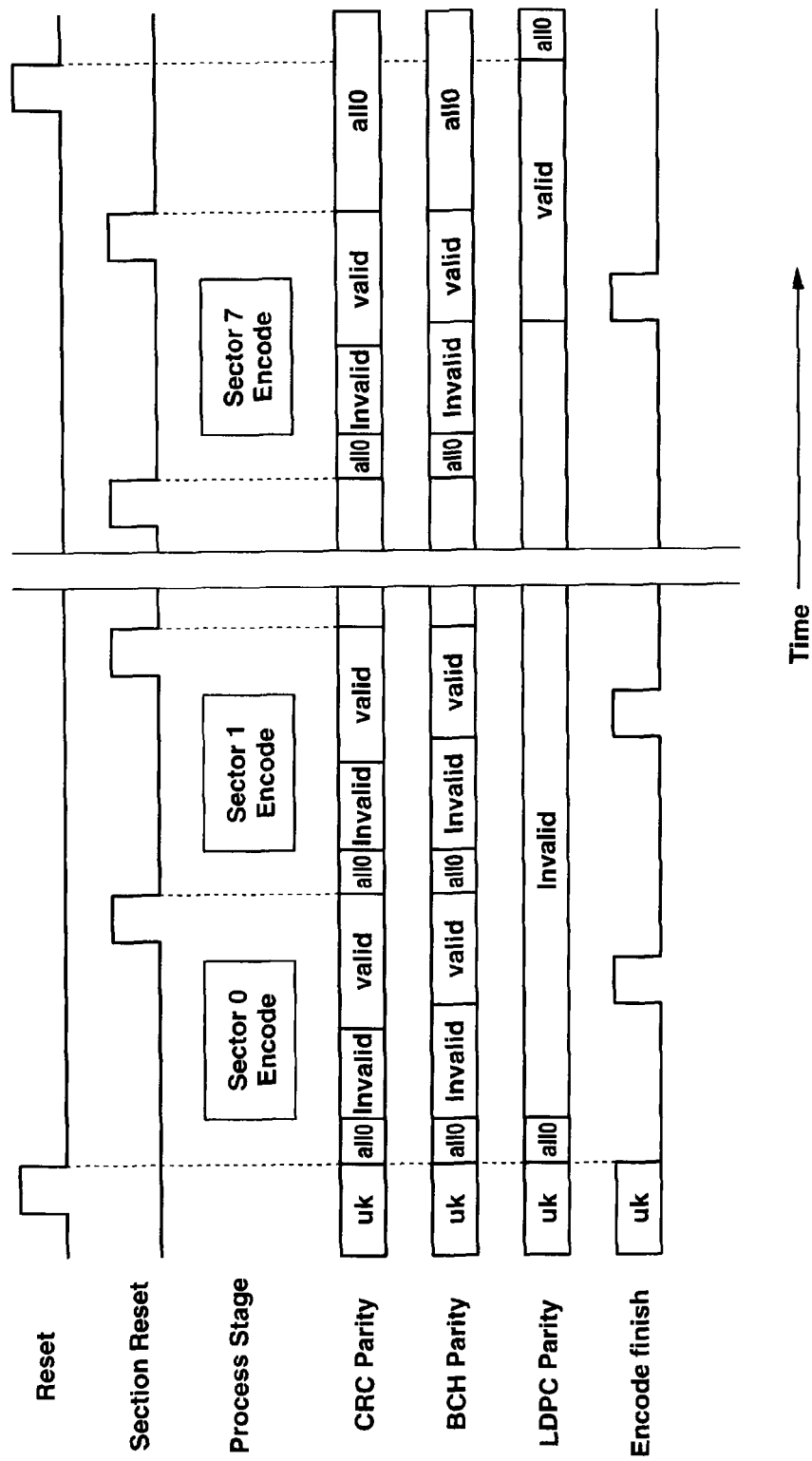
FIG. 7 is a timing chart of the encoding processing in the memory system in the first embodiment.

Now, using FIGS. 6 and 7, the encoding processing in the system 1 will be described in detail. Hereinafter, description will be made according to a flowchart of FIG. 6. In FIG. 7, "uk" means an indeterminate state before resetting, "all0" means a state in which the buffer is reset, and "Valid" means a state in which processing is finished and an output result is valid.

<Step S10>

The CPU 3 of the host 2 writes frame data to be stored in the NAND memory section 15, on a sector basis via the interfaces 12 and 22 to the buffer 23, which is data buffer. That is, the frame data is input to the ECC 20 and divided into eight pieces of sector data.

<Step S11>

A sector number K is initialized.

<Step S12>

The ECC1 encoder 26 generates the CRC parity of the sector K. It is to be noted that the CRC parity generation of the ECC1 encoder 26, and the CRC syndrome calculation circuit 31 of the ECC1 decoder 30 are not essential components of the memory system 1.

<Step S13>

The ECC1 encoder 26 generates the BCH parity of the sector K.

<Steps S14 and S15>

The encoding processing by the ECC1 encoder 26 is performed until the parity of all eight sectors is generated.

<Step S16>

The ECC2 encoder 27 generates the LDPC parity of the frame data. As will be described below, the processing by the ECC1 encoder 26 and the processing by the ECC2 encoder 27 are performed in parallel.

<Step S17>

The ECC control section 21 transfers the data stored in the buffer 23 along with the parity calculated in the encoder 25 to the interface 24 and writes the data to the NAND memory section 15.

Here, as shown in a timing chart shown in FIG. 7, the encoding processing by the ECC1 encoder 26 and the encoding processing by the ECC2 encoder 27 are performed as parallel processing. When a sector 0, for example, is encoded in the ECC2 encoder 27, data (512 bytes) of the sector 0 is first input to the ECC2 encoder 27 and then the CRC parity (4 bytes) is input. As necessary, the encoding processing is temporarily stopped until the CRC parity becomes valid. After (data+CRC parity of eight sectors) is input to the ECC2 encoder 27, the parity calculation of the ECC2 encoder 27 is finished.

Figure 8:
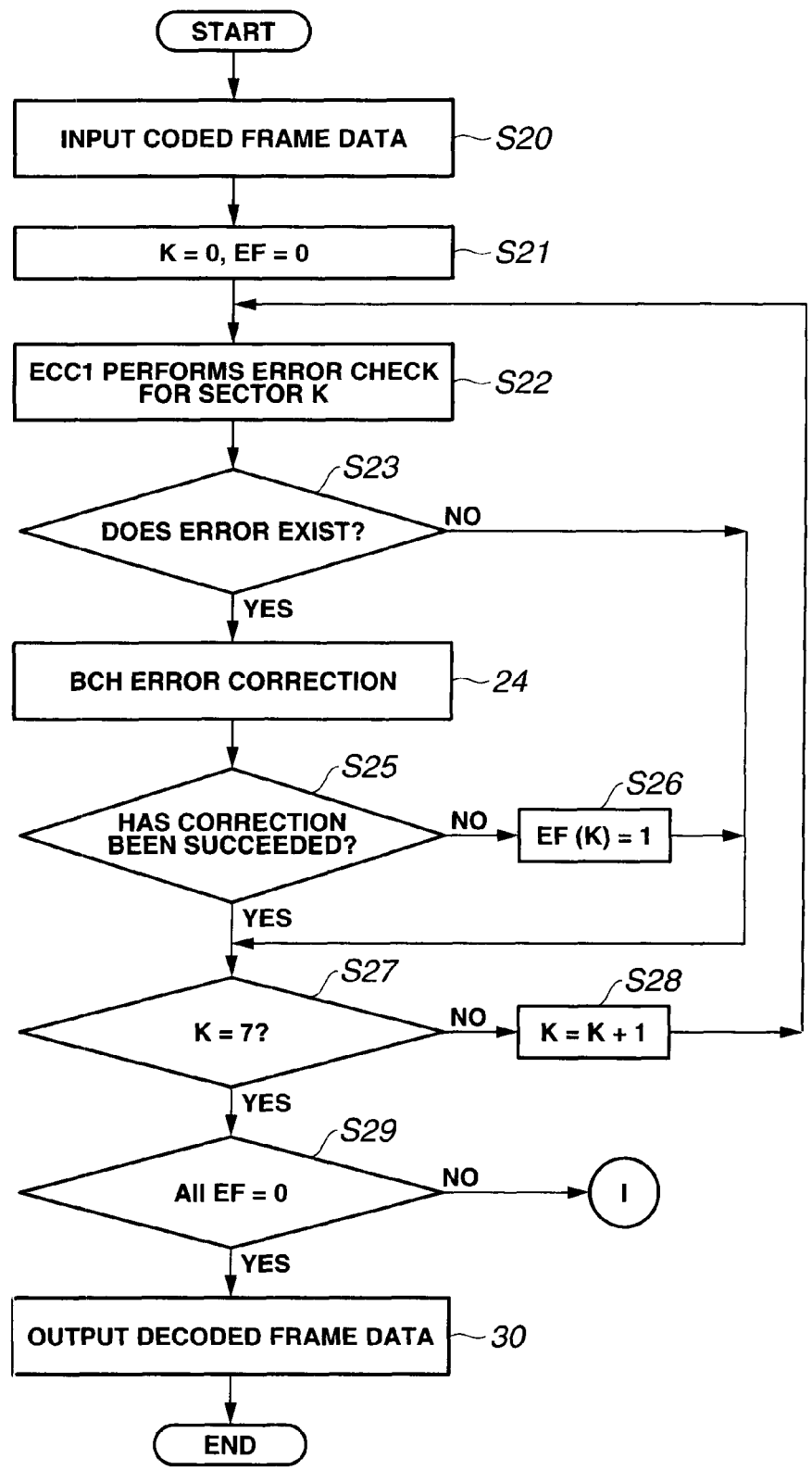
FIG. 8 is a flowchart showing a flow of processing of an ECC1 decoder in the memory system in the first embodiment.

Now, using FIGS. 8, 9, and 10, the decoding processing in the memory system 1 will be described in detail. First, the decoding processing by the ECC1 decoder 30 will be described according to a flowchart of FIG. 8.

<Step S20>

The ECC control section 21 reads, via the interface 24, coded frame data stored in the NAND memory section 15, divides the frame data into eight sectors, and stores the sectors in the buffer 23.

<Step S21>

A frame number K and sector error flags (EF(1) to EF(7)) are initialized.

<Step S22>

The CRC syndrome calculation circuit 31 and the BCH decoder 32 of the ECC1 decoder 30 calculate CRC and BCH syndromes to check for an error. That is, in algebraic decoding of a BCH code, an error locator polynomial is output as a decoding result. The output of the error locator polynomial allows detecting only whether an error exists, or in other words, the presence or absence of an error. By solving the error locator polynomial, an error bit can be located in the BCH code and therefore the error can be corrected. If no error exists, the output syndromes are "0."

<Steps S23 and S24>

If an error is detected (S23: Yes), the ECC1 decoder 30 performs error correction processing by the BCH decoder 32 on a sector basis in S24. If no error exists (S23: No), the ECC1 decoder 30 transitions to the processing on a next sector.

<Step S25>

If the error correction by the BCH decoder 32 has succeeded (Yes), the ECC1 decoder 30 transitions to the processing on the next sector.

<Step S26>

If the error correction by the BCH decoder 32 has failed (No), the ECC1 decoder 30 transitions to the processing on the next sector. Then, "1" is set in the EF section 44, which is configured to set and store a sector error flag (EF(K)) corresponding to the sector (error sector) for which the ECC1 decoder 30 could not correct the error.

<Steps S27 and S28>

The ECC1 decoder 30 repeats the processing from S22 until the error check and correction processing on the eight sectors (K=0 to 7) is finished.

<Step S29>

If the error flags for the eight sectors are all "0" at the completion of the error check and correction processing on the eight sectors (Yes), the ECC control section 21 finishes the decoding processing and sends a notification to the CPU 3 of the host 2. In response to the notification, the CPU 3 reads the NAND read data from the buffer 23 and, for example, transfers the data to main memory. If at least one of the error flags for the eight sectors is set to "1" (No), the ECC control section 21 performs (I), that is, the LDPC error correction processing by the ECC2 decoder 40 shown in FIG. 10.

Figure 9:
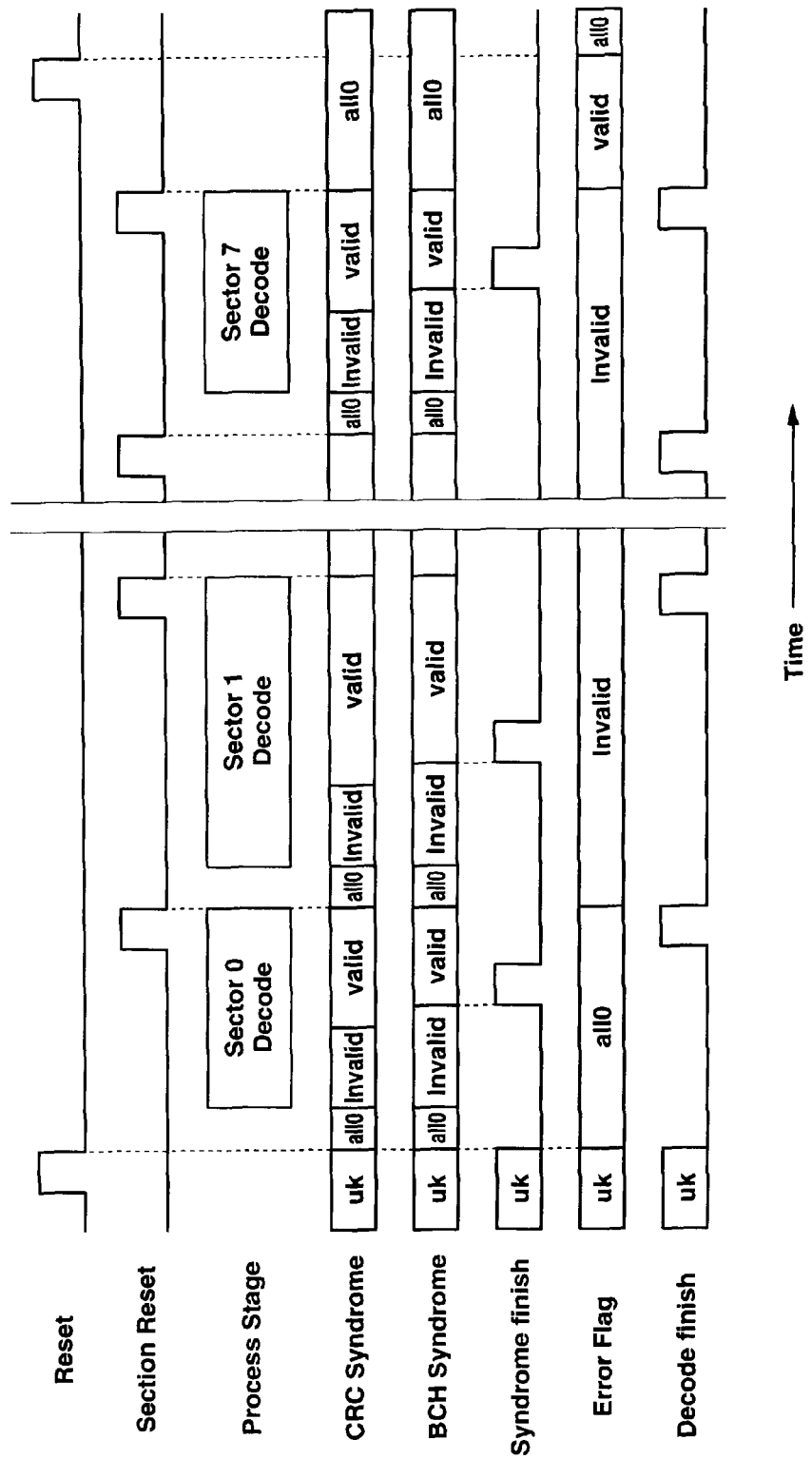
FIG. 9 is a timing chart of the ECC1 decoder in the memory system in the first embodiment.
Figure 10:
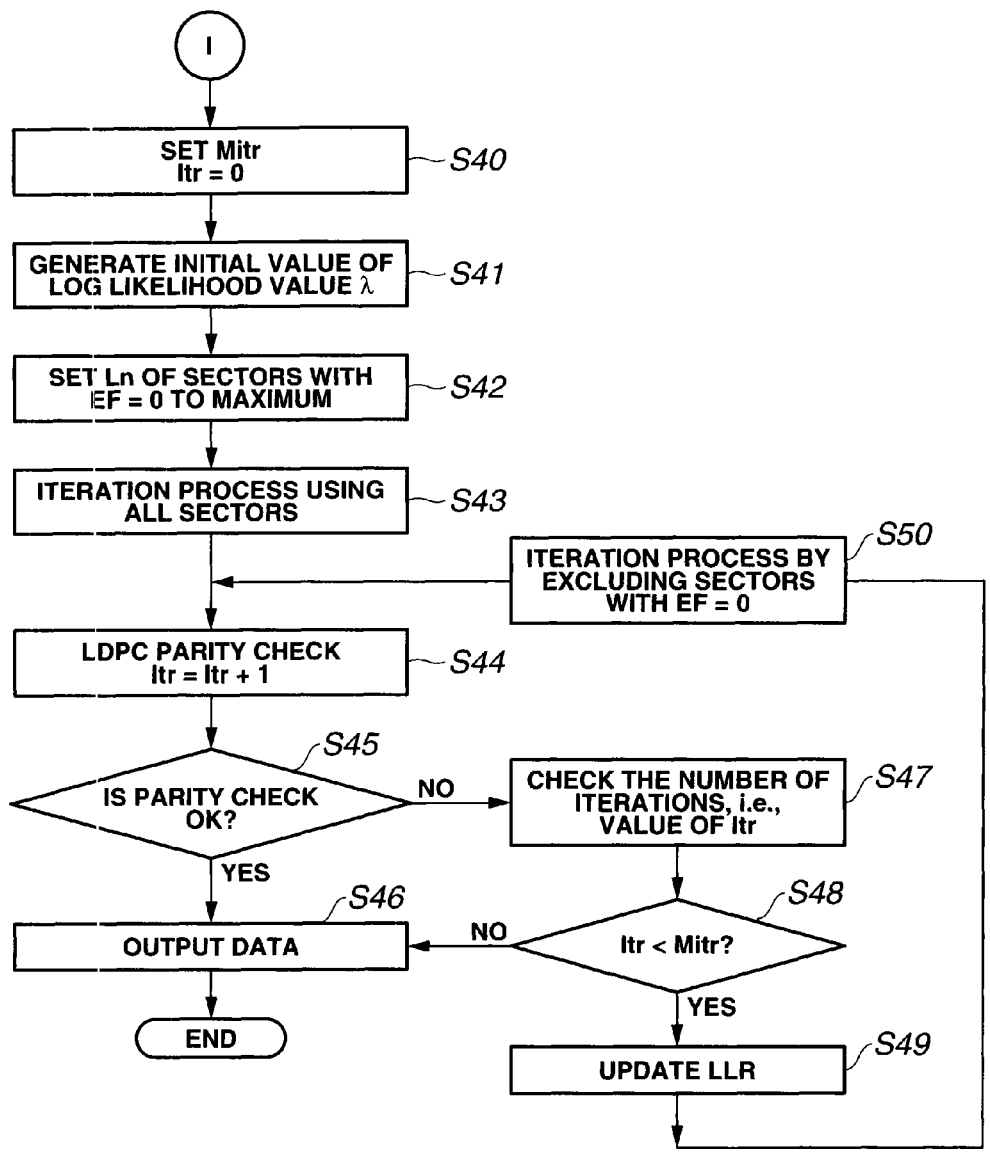
FIG. 10 is a flowchart showing a flow of processing of an ECC2 decoder in the memory system in the first embodiment.

As shown in a timing chart of FIG. 9, the decoding processing by the CRC syndrome calculation circuit 31, the BCH decoder 32, and the ECC2 decoder 40 is performed in parallel with adjusted timing.

Next, the decoding processing by the ECC2 decoder 40 will be described according to a flowchart of FIG. 10.

<Step S40>

In the decoding processing in the ECC2 decoder 40, first, a maximum number Mitr of iterations is set and a parameter Itr indicating the number of iterations is set to "0." The maximum number of iterations does not have to be set every time, so that a preset value may be used. The maximum number of iterations may be specified as a number, for example 50, or may be limited by time, for example 1/90 second.

<Step S41>

The ECC2 decoder 40 generates an original log likelihood ratio LLR of each bit from the frame data.

<Step S42>

The ECC control section 21 checks the error flags stored in the EF section 44. If an error flag for a sector K, i.e., EF(K) is "0," that is, if the sector K contains no error, the reliability of the sector data is increased regardless of the original likelihood ratio. For example, the absolute value of the log posterior probability ratio Ln is updated to the maximum.

<Step S43>

The ECC control section 21 causes the ECC2 decoder 40 to perform a first round iteration process using all sector data.

<Step S44>

The ECC2 decoder 40 performs parity check, and at the same time performs one increment, which is an operation of incrementing the value of Itr by one.

<Steps S45 and S46>

If the parity check results in OK (Yes), the decoding processing is finished and the CPU 3 of the host 2 is notified in step S46. In response to the notification, the CPU 3 reads the NAND read data from the buffer 23 and transfers the data to the main memory, for example.

<Step S47>

The ECC2 decoder 40 checks the number of iteration processes (the number of rounds), i.e., the value of Itr.

<Step S48>

If the number of iteration processes, i.e., the value of Itr reaches the maximum number of iterations Mitr (No), the ECC2 decoder 40 finishes the decoding processing without performing further iteration processes and notifies the CPU 3 of the host 2 of the failure of the decoding processing.

<Step S49>

If the number of iteration processes, i.e., the value of Itr is smaller than the maximum number of iterations Mitr (S48: Yes), the ECC2 decoder 40 updates the LLR.

<Step S50>

Basically, the ECC control section 21 preferentially selects second LDPC decoding processing. Therefore, in a second round and subsequent round iteration processes, the ECC2 decoder 40 performs a second iteration process that excludes sector data with EF=0, that is, errorless sector data. In other words, the Ln calculation for the sector data with EF=0 is skipped. Specifically, calculation (column processing) of the posterior probability $\beta$ and calculation (row processing) of external information $\alpha$ used in the $\beta$ calculation, which are necessary for the Ln calculation, are skipped. That is, the row processing/column processing are skipped for the sector data for which the error flag is not set (EF=0).

The ECC2 decoder 40 repeats the processing from S44.

As described above, the control method for the memory system 1 includes: performing first LDPC decoding in which an iteration process is performed using all sector data; performing second LDPC decoding in which an iteration process is performed without using sector data for which a sector error flag is not set with no error data contained; and performing LDPC processing selection in which either one of the first LDPC decoding and the second LDPC decoding is selected.

In the memory system 1 and the control method for the memory system 1 in the present embodiment, for example, if four of eight sectors contain no error, the second LDPC decoding is preferentially selected and performed rather than the first LDPC decoding. This reduces the row processing/column processing time per round by approximately half. Thus a memory system and a control method for the memory system with a high processing speed are realized.

It is apparent that the same advantage as the memory system 1 in the present embodiment is achieved even when the memory card 10 (semiconductor storage apparatus with NAND memory), the memory controller 50, or the error correction section (error correction circuit) 20 included in the memory system 1 of the present embodiment is used in combination with other members. That is, each of the above components has the advantage of the present invention.

Second Embodiment

Now, a memory system 1B and a control method for the memory system 1B in a second embodiment of the present invention will be described. Since the memory system 1B and the control method for the memory system 1B in the present embodiment is similar to the memory system 1 and the control method for the memory system 1 in the first embodiment, the same components will be given the same symbols and description thereof will be omitted.

Figure 11:
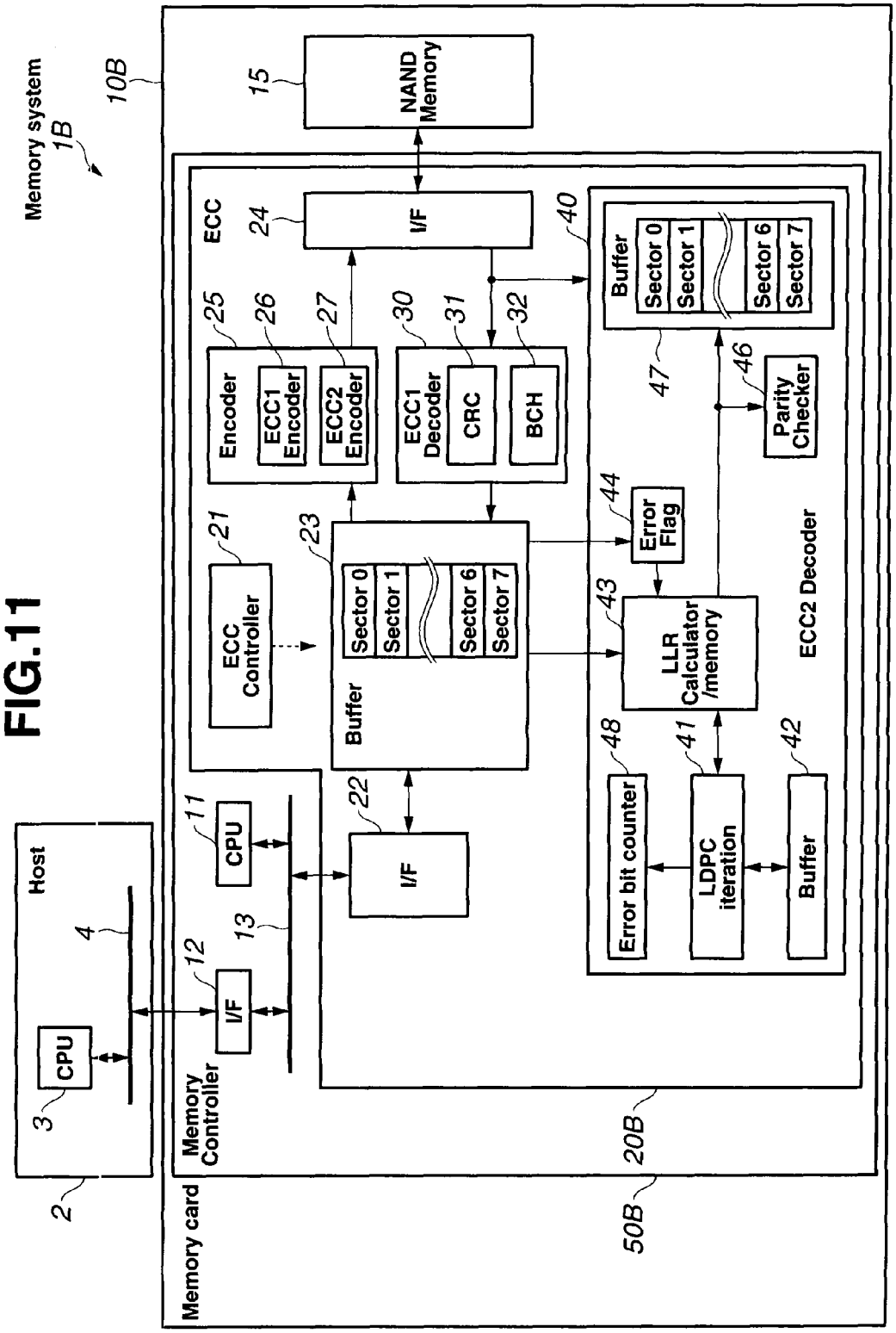
FIG. 11 is a configuration diagram showing a configuration of a memory system in a second embodiment.

As shown in FIG. 11, an ECC2 decoder 40B of an ECC 20B of a memory controller 50B of a memory card 10B of the memory system 1B in the present embodiment has a corrected bit counter 48 having a function of counting the number of corrected bits. On completion of each iteration process, the corrected bit counter 48 counts the number of corrected bits that have been error-corrected in the iteration process (round). In the memory controller 50B, basically the second LDPC decoding processing is preferentially selected. However, if it is detected based on the count result of the corrected bit counter 48 that the number of error-corrected bits does not increase beyond a predetermined value and therefore the correction processing is stagnating, the next round is performed using all sector data including errorless sector data that has been excluded from the row processing/column processing (iteration process), or in other words, by selecting the first LDPC decoding processing.

Figure 12:
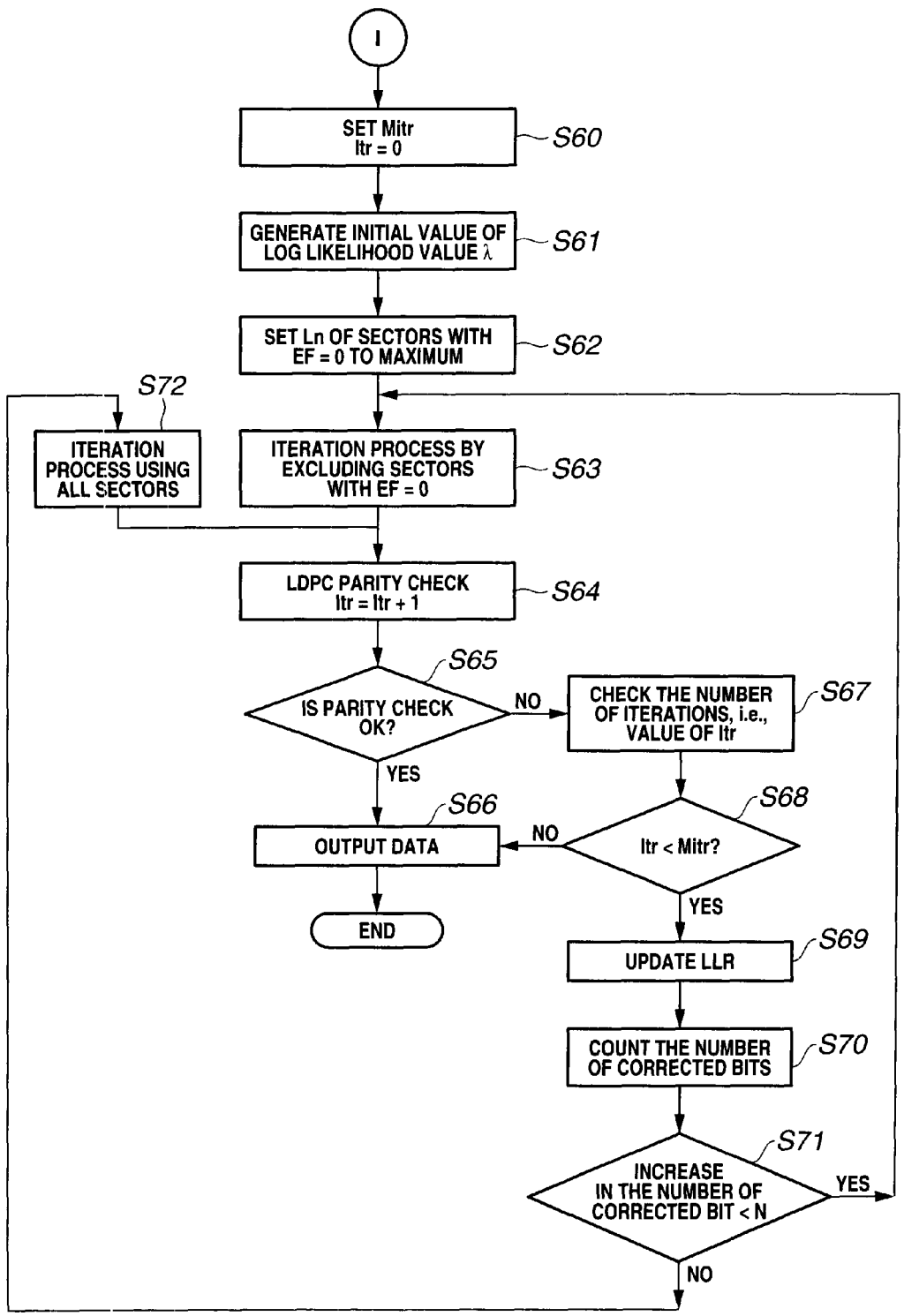
FIG. 12 is a flowchart showing a flow of processing of an ECC2 decoder in the memory system in the second embodiment.

Hereinafter, description will be made according to a flowchart of FIG. 12. Since steps S60 to S69 in FIG. 12 are the same as above-described steps S40 to S49 in FIG. 10, description thereof will be omitted.

<Step S70>

The corrected bit counter 48 counts the number of error-corrected bits. That is, it counts the number of error bits successfully corrected in the current iteration process from the difference between the number of error bits at the completion of the previous iteration process and the number of error bits at the completion of the current iteration process.

<Step S71>

If the number of error-corrected bits has not much increased, for example if it is not greater than a predetermined value N bits (No), this means that the correction processing is stagnating. In this case, it is likely to take a long time to finish the decoding processing by simply repeating the iteration process. On the other hand, if the number of error-corrected bits exceeds the predetermined value N bits (Yes), the ECC control section 21 repeats the iteration process from step S63.

<Step S72>

If the number of error-corrected bits is not greater than the predetermined value N bits, the ECC control section 21 selects the first LDPC decoding processing using all sector data and processes the next round. The reason for this is as follows. The LDPC decoding processing essentially performs error correction in such a manner that $\alpha$ and $\beta$ of data with high reliabilities are propagated as messages to data with low reliabilities to increase the reliabilities of error data. Excluding all sector data with high reliabilities from the message propagation loop may cause the processing to be blocked up within the loop made up of error data, preventing the convergence of the error correction processing.

Thereafter, the processing is continued from step S64.

For the purpose of reducing the circuit size, means of detecting an increase in the number of errorless sectors on completion of each round may be provided instead of using the corrected bit counter 48. This implementation may also achieve an equivalent effect to using the corrected bit counter 48 if error bits per sector are not many As described above, the control method for the memory system 1B in the present embodiment includes: performing first LDPC decoding in which an iteration process is performed using all sector data; performing second LDPC decoding in which an iteration process is performed without using sector data for which a sector error flag is not set; and performing LDPC processing selection in which either one of the first LDPC decoding and the second LDPC decoding is selected, wherein selecting the decoding processing includes selecting based on a count result of a corrected bit count section configured to count the number of corrected error bits in each iteration process.

By using sector data with a high reliability as well for the processing, the memory system 1B in the present embodiment can increase the efficiency of the error correction processing when the correction processing is stagnating, although the processing load temporarily increases. Therefore, in addition to the advantage of the memory system 1 and the control method for the memory system 1 in the first embodiment, the memory system 1B and the control method for the memory system 1B realizes a small circuit size and a higher processing speed.

Third Embodiment

Now, a memory system 1C and a control method for the memory system 1C in a third embodiment of the present invention will be described. Since the memory system 1C and the control method for the memory system 1C in the present embodiment is similar to the memory system 1 and the control method for the memory system 1 in the first embodiment, the same components will be given the same symbols and description thereof will be omitted.

Figure 13:
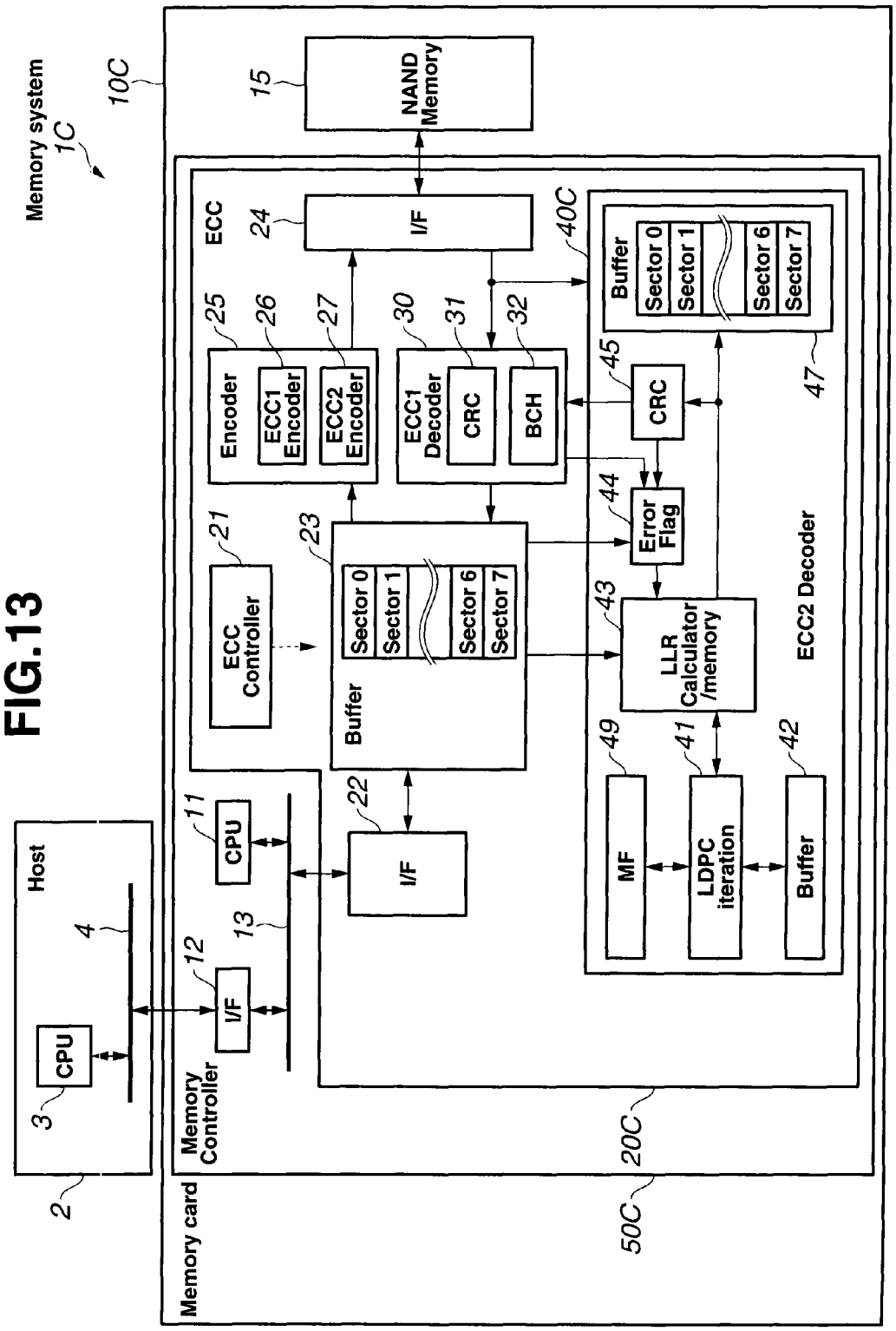
FIG. 13 is a configuration diagram showing a configuration of a memory system in a third embodiment.

As shown in FIG. 13, an ECC2 decoder 40C of an ECC 20C of a memory controller 50C of a memory card 10C of the memory system 1C in the present embodiment removes the parity check circuit 46 checking the completion of error correction by using a check matrix, and causes the CRC syndrome calculation circuit 45 to check the success or failure of the error correction instead. The CRC syndrome calculation circuit 45 may even be removed to further cause the CRC syndrome calculation circuit 31 of the ECC1 decoder 30 to check the success or failure of the error correction instead.

Moreover, the ECC2 decoder 40C has a sector modifier flag (hereinafter also referred to as a "modifier flag (MF)") 49 having a function of notifying the ECC control section 21 that an error sector has data whose code has changed. The sector modifier flag 49 sets "1" for an error sector (EF=1) containing data whose code has changed, that is, data such that "0" has changed to "1" or "1" has changed to "0."

Figure 14:
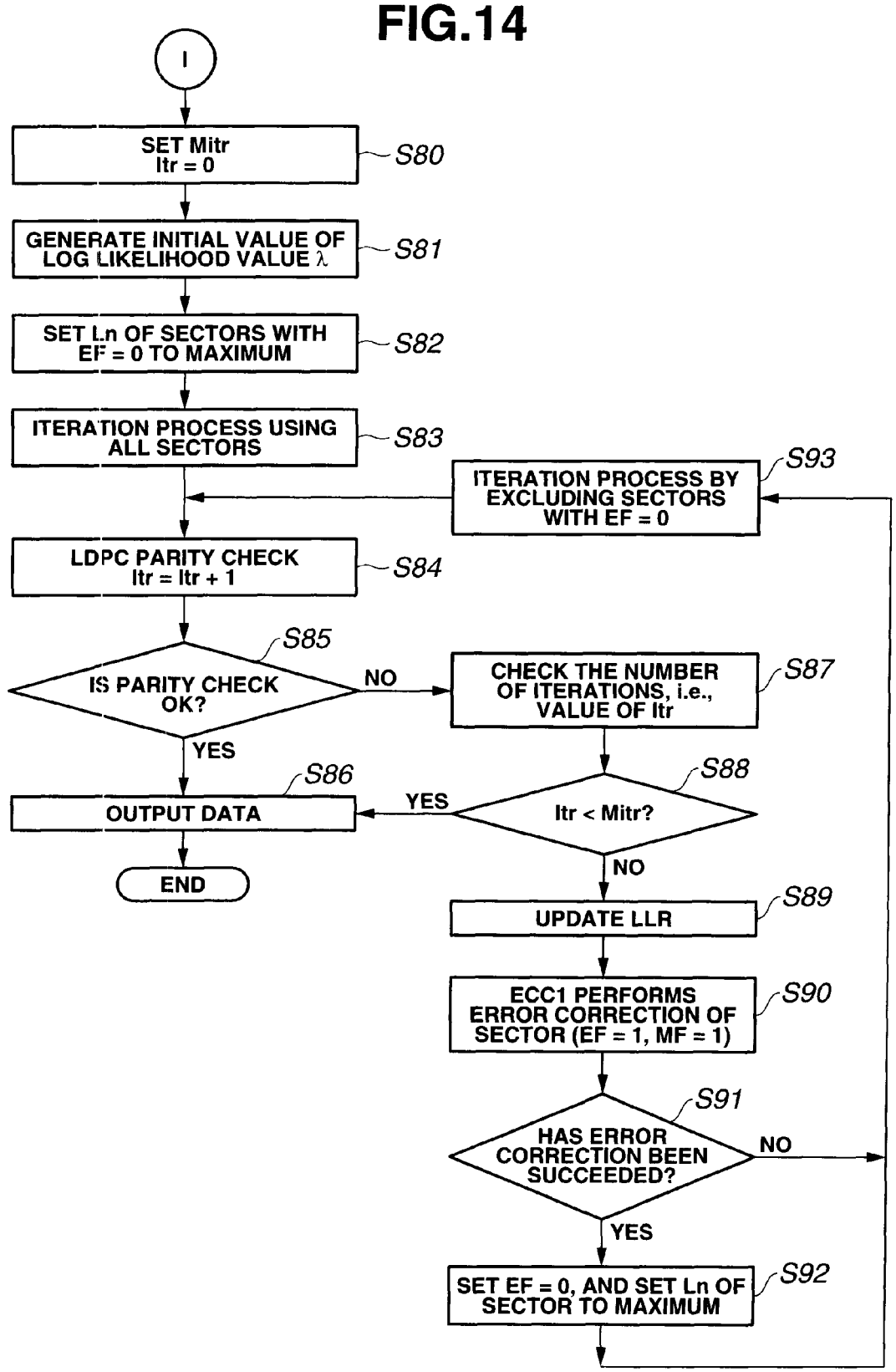
FIG. 14 is a flowchart showing a flow of processing of an ECC2 decoder in the memory system in the third embodiment.

Thus the ECC2 decoder 40C causes the error correction processing by the BCH decoder 32 of the ECC1 decoder 30 to be performed in connection with the LDPC decoding processing by the ECC2 decoder 40C to accelerate the error correction processing. Hereinafter, description will be made according to a flowchart of FIG. 14. Since steps S80 to S89 in FIG. 14 are the same as above-described steps S40 to S49 in FIG. 10, description thereof will be omitted.

<Step S90>

Based on the sector modifier flag 49, the ECC control section 21 controls to cause the error correction processing by the BCH decoder 32 to be performed again on a sector that is an error sector (EF=1) and that has a sector modifier flag (MF)=1.

If a plurality of error sectors simultaneously have a sector modifier flag set to 1, one error sector may be selected with a predetermined algorithm to perform the error correction processing by the BCH decoder 32.

<Step S91 and S92>

If the error correction by the BCH decoder 32 has succeeded (S91; Yes), data, such as the likelihood ratio, related to the error-corrected sector is updated and the corresponding sector error flag is cleared with timing that does not conflict with the processing by the ECC2 decoder 40C (for example, on completion of one iteration process).

If the error correction by the BCH decoder 32 has failed (S91; No), the normal processing is repeated.

Figure 15:
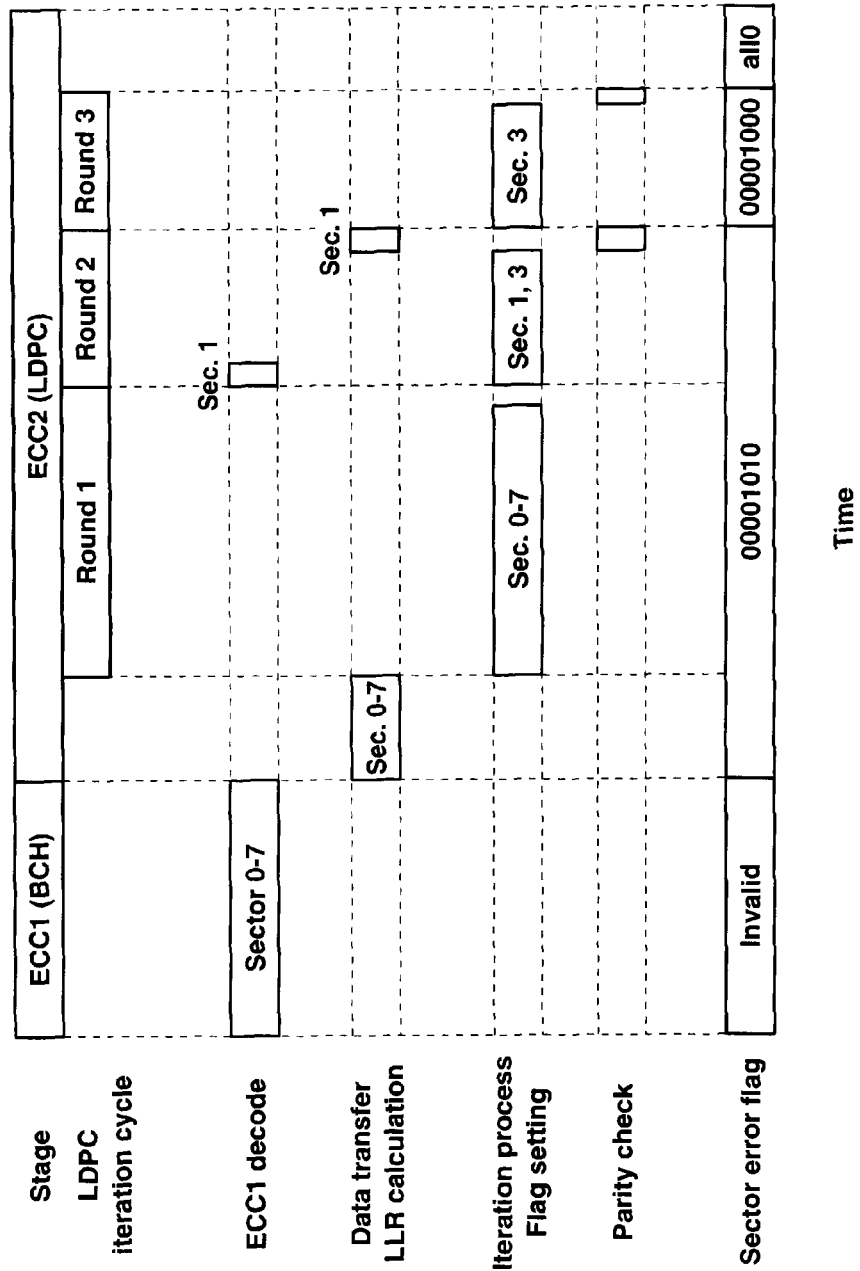
FIG. 15 is a timing chart of the ECC2 decoder in the memory system in the third embodiment.

Here, the control method for the memory system 1C will be further described by taking a timing chart of FIG. 15 as an example. FIG. 15 represents operation when the error correction in the ECC1 decoder 30 for the sector 1 and the sector 3 fails. After the completion of the processing by the ECC1 decoder 30, the LDPC decoding processing by the ECC2 decoder 40C is started. At the beginning of the processing, data read from the NAND memory section 15 is converted into log likelihood ratios. At this point, the conversion is performed by increasing the reliability of errorless sectors 0, 2, and 4 to 7, for example, by setting the absolute value of Ln to the maximum. A first iteration process (round 1) of the LDPC decoding processing is performed for all eight sectors. In the example of FIG. 15, the modifier flag for the error sector 1 is set to "1" on completion of the round 1. Therefore, in a round 2, the decoding processing by the BCH decoder 32 is performed again on the sector 1. The sector 1 is then successfully decoded by the BCH decoder 32, so that the reliability of the sector 1 is updated to the maximum and the error flag for the sector 1 is cleared to be "0." The sector 3 is then successfully error-corrected by the processing in a round 3, so that the decoding processing is finished.

The above description takes as an example the memory system 1C employing an ECC1-ECC2 serial decoding processing scheme, in which the ECC2 decoder 40C starts the processing after the completion of the processing by the ECC1 decoder 30 as shown in FIG. 15. However, an ECC1-ECC2 parallel decoding processing scheme may be employed, in which the ECC1 decoder 30 and the ECC2 decoder 40C start the decoding processing substantially simultaneously. In this case, the first round iteration process by the ECC2 decoder 40C is performed by considering all sectors as error sectors (EF=1). After the completion of the first round iteration process by the ECC2 decoder 40C, depending on the result of the processing by the ECC1 decoder 30, the sector error flag is set/the reliability update processing is performed. Subsequent processing is as described above.

In the ECC1-ECC2 parallel decoding processing scheme, preferably the data size per sector is reduced and further the correction processing ability of the ECC1 decoder 30 (ECC1 encoder 26) is set to be lower, compared to the ECC1-ECC2 serial decoding processing scheme. This is because setting the correction processing ability to be lower means reducing the parity size, which allows avoiding a reduction in the encoding rate to achieve accelerated processing and reduced power consumption. In the ECC1-ECC2 parallel decoding processing scheme, one sector may be of 128 bytes with 4-bit correctable parity, for example.

As described above, the control method for the memory system 1C further includes: performing first LDPC decoding in which an iteration process is performed using all sector data; performing second LDPC decoding in which an iteration process is performed without using sector data for which a sector error flag is not set; performing LDPC processing selection in which either one of the first LDPC decoding and the second LDPC decoding is selected; setting a sector modifier flag for identifying sector data containing bit data whose code has changed in the first LDPC decoding or the second LDPC decoding; performing second hard decision code decoding in which hard decision code parity is used to perform error correction of sector data for which the sector modifier flag and the sector error flag are set; and resetting the sector error flag for the error-corrected sector data resulting from the second hard decision code decoding.

In the memory system 1C, the BCH decoder 32 complements the decoding processing of the ECC2 decoder 40C. Therefore, in addition to the advantage of the memory system 1 or the control method for the memory system 1 in the first embodiment, the memory system 1C and the control method for the memory system 1C realizes a small circuit size and enables an increased processing speed.

<First Variation>

In the memory systems 1 etc. and the control methods for the memory systems 1 etc. in the above-described embodiments of the present invention, the iteration process is performed by skipping sectors identified as errorless in the processing by the ECC1 decoder 30, or in other words, by excluding sectors with the sector error flag (EF)=0.

Figure 16:
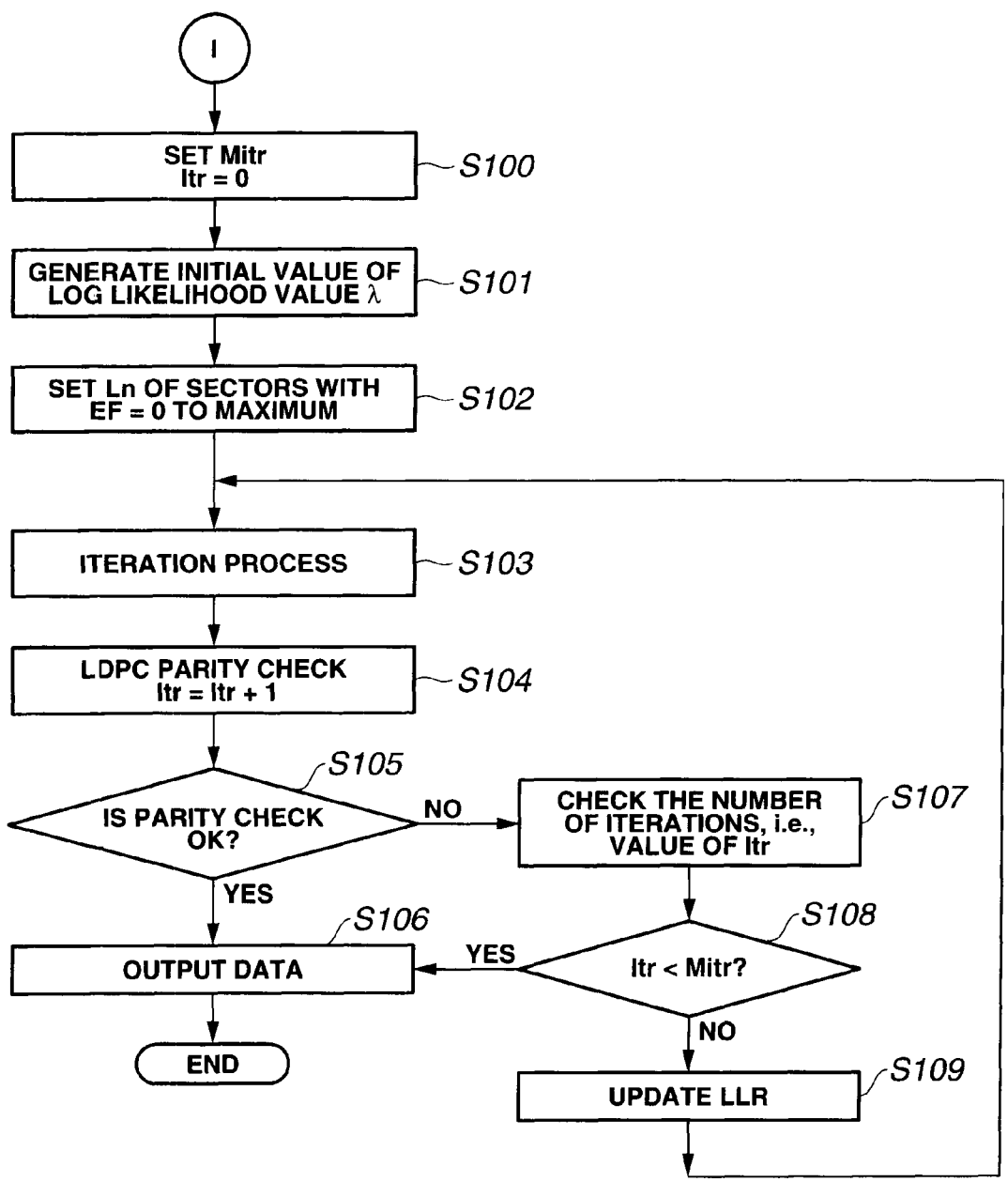
FIG. 16 is a flowchart showing a flow of processing of an ECC2 decoder in a memory system in a first variation.

On the other hand, as shown in FIG. 16, in a memory system in the present variation, the absolute value of Ln of the sectors with the sector error flag (EF)=0 is set to the maximum, and the iteration process is performed using all sectors.

The memory system in the present variation performs the LDPC decoding processing using data with a high reliability at all times, thereby enabling fast processing.

<Second Variation>

In the memory system 1C and the control method for the memory system 1C in the above-described third embodiment of the present invention, the iteration process is performed by skipping sectors identified as errorless in the processing by the ECC1 decoder 30, or in other words, by excluding sectors with the sector error flag (EF)=0.

Figure 17:
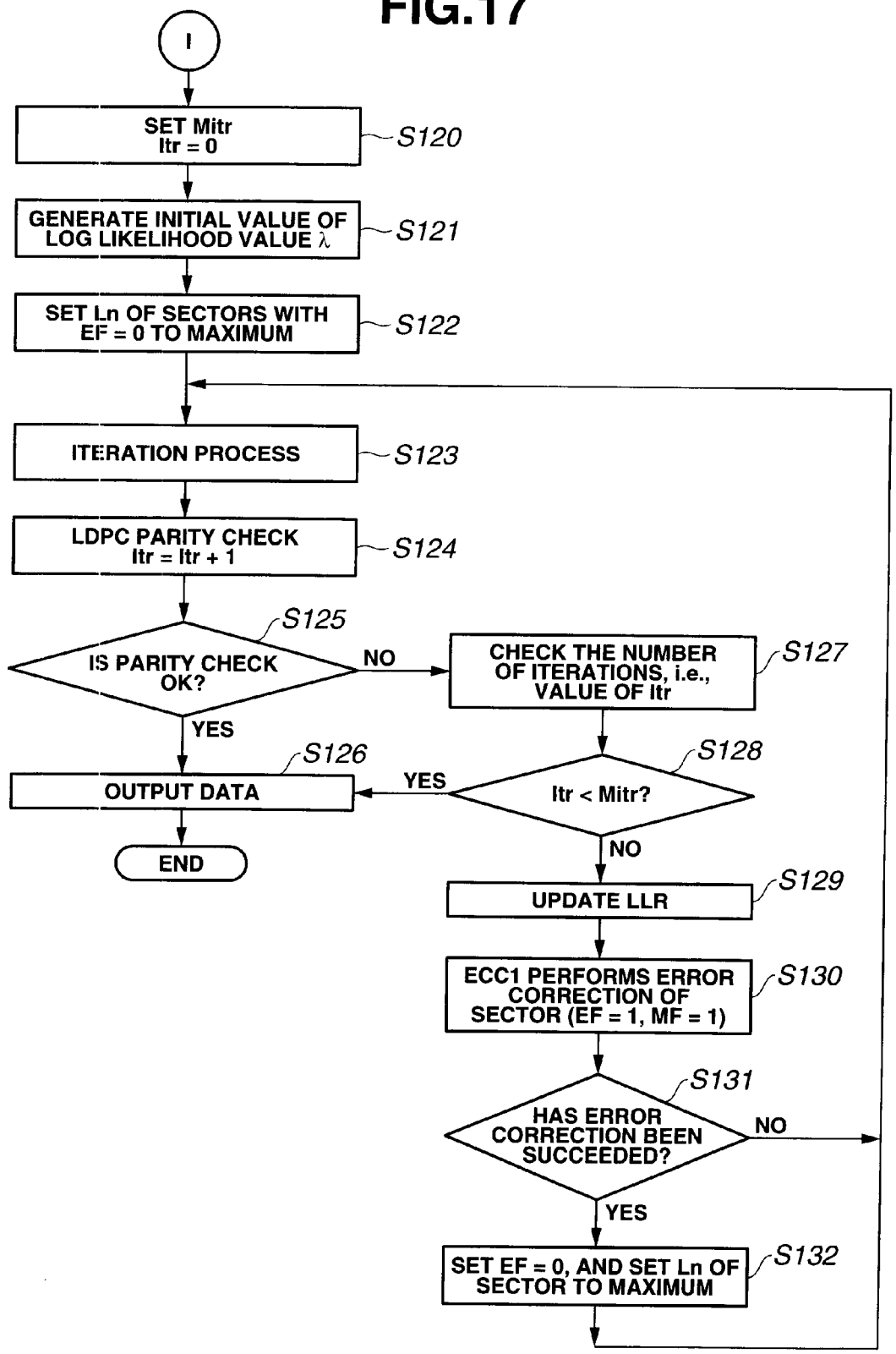
FIG. 17 is a flowchart showing a flow of processing of an ECC2 decoder in a memory system in a second variation.

On the other hand, as shown in FIG. 17, in a memory system in the present variation, the reliability of the sectors with the sector error flag (EF)=0 is increased, for example the absolute value of Ln of the sectors with the sector error flag (EF)=0 is set to the maximum, and the iteration process is performed using all sectors.

That is, the memory system in the present variation is a memory system having a memory card that is a storage apparatus configured to store coded frame data resulting from encoding frame data composed of a plurality of pieces of sector data and a host configured to send and receive the frame data to and from the storage apparatus, the storage apparatus including: a first ECC encoder configured to perform hard decision encoding processing with a hard decision code on a sector data basis; a second ECC encoder configured to perform LDPC encoding processing with an LDPC code on a frame data basis; a first ECC decoder configured to perform hard decision code decoding processing; a second ECC decoder configured to perform LDPC decoding processing with the LDPC code on a frame data basis; a sector error flag section configured to store, for each sector, identification information about presence or absence of error data in the hard decision code decoding processing; and an ECC control section configured to perform, in the LDPC decoding processing, control of increasing a reliability of sector data containing no error data based on the information in the sector error flag section.

A control method for the memory system in the present variation includes: performing a CRC encoding in which CRC parity of each of a plurality of pieces of sector data constituting frame data is generated and added; performing hard decision encoding in which hard decision code parity of each of the pieces of sector data is generated and added; performing LDPC encoding in which LDPC parity of the frame data including the CRC parity and the hard decision code parity is generated to produce coded frame data; storing the coded frame data in a NAND memory section; reading the coded frame data from the NAND memory section; performing CRC error detection in which presence or absence of an error in each of the pieces of sector data is detected from the CRC parity of each of the pieces of sector data constituting the coded frame data; performing hard decision code decoding in which error correction is performed using the hard decision code parity for the sector data for which an error is detected in the CRC error detection; setting a sector error flag for identifying the sector data found to contain an error in the CRC error detection or the hard decision code decoding; and performing LLR change in which a reliability of the sector data without the sector error flag being set is increased when the coded frame data is subjected to decoding processing with the LDPC parity.

The memory system and the control method for the memory system in the present variation performs the LDPC decoding processing using data with a high reliability at all times, thereby enabling fast processing.

<Third Variation>

In the memory systems 1 etc. and the control methods for the memory systems 1 etc. in the above-described embodiments of the present invention, the iteration process is performed by skipping sectors identified as errorless in the processing by the ECC1 decoder 30, or in other words, by excluding sectors with the sector error flag (EF)=0.

Figure 18:
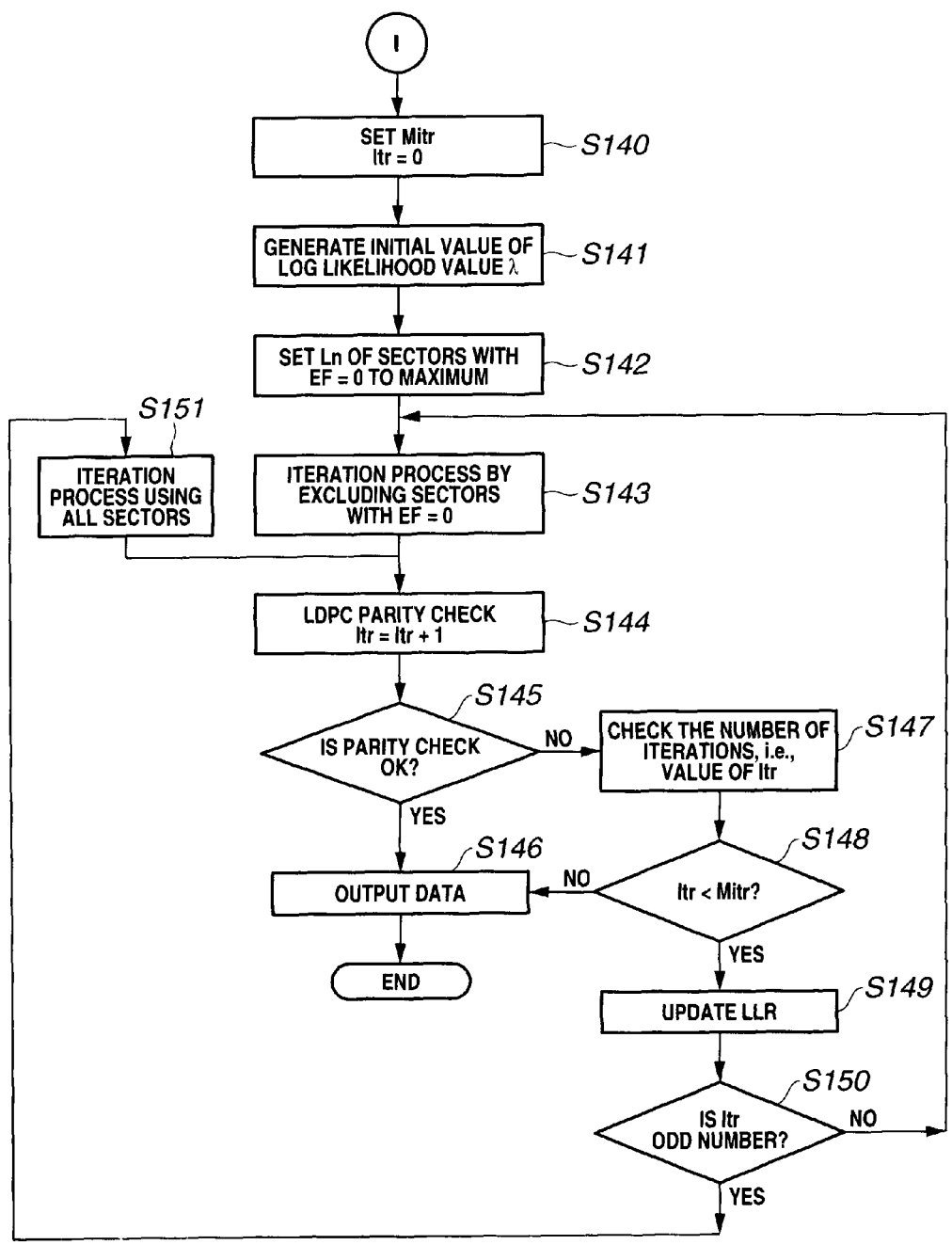
FIG. 18 is a flowchart showing a flow of processing of an ECC2 decoder in a memory system in a third variation.

On the other hand, as shown in FIG. 18, a memory system in the present variation performs the iteration process using all sectors if the number of rounds (the number of iterations: Itr) is an odd number.

The memory system in the present variation performs the LDPC decoding processing using data with a high reliability once in two iteration processes, thereby enabling fast processing.

Instead of using all sectors, error sectors (EF=1) and errorless sectors (EF=0) adjacent to the error sectors (EF=1) may be used. The LDPC decoding processing may also be performed using data with a high reliability once in three iteration processes, for example.

Thus, the present invention is not limited to the above-described embodiments and variations but allows various modifications and alterations without departing the spirit of the present invention. For example, instead of the BCH code, an RS code may be used as the hard decision code. Also, the above-described embodiments and variations may be combined as appropriate. For example, the memory system 1 in the first embodiment may be combined with the control method in the third variation, and the ECC1-ECC2 parallel decoding processing scheme may be employed.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A memory system having a storage apparatus configured to store coded first data resulting from encoding first data composed of a plurality of pieces of second data and a host configured to send and receive the first data to and from the storage apparatus, the storage apparatus comprising:
    a first ECC decoder configured to perform hard decision code decoding processing with a hard decision code on a second data basis;
    a second ECC decoder configured to perform LDPC decoding processing with an LDPC code on a first data basis;
    a second data error flag section configured to set, for each second data, a second data error flag that stores information about presence or absence of error data in the hard decision code decoding processing; and
    an ECC control section configured to perform, in the LDPC decoding processing, control of increasing an absolute value of a log likelihood ratio indicating a reliability of second data containing no error data based on the information in the second data error flag section.

2. The memory system according to claim 1, wherein
    the ECC control section performs the LDPC decoding processing by selecting either one of first LDPC decoding processing in which an iteration process is performed using all the second data and second LDPC decoding processing in which an iteration process is performed without using the second data containing no error data.

3. The memory system according to claim 2, wherein the ECC control section preferentially selects the second LDPC decoding processing.

4. The memory system according to claim 3, wherein the ECC control section counts the number of newly corrected error bits in each iteration process, and based on a result of the counting, selects the first LDPC decoding processing if the number of newly corrected error bits is less than a predetermined value.

5. The memory system according to claim 1, wherein in the LDPC decoding processing, the ECC control section again performs error correction processing using the hard decision code for second data whose code has changed and resets the second data error flag for the resulting error-corrected second data.

6. The memory system according to claim 1, wherein the ECC control section sets the reliability of the second data containing no error data to a maximum.

7. The memory system according to claim 1, wherein the storage apparatus is a memory card with a NAND memory section.

8. The memory system according to claim 1, wherein the first data is frame data and the second data is sector data.

9. A control method for a memory system, comprising:
performing CRC encoding in which CRC parity of each of a plurality of pieces of second data constituting first data is generated and added;
performing hard decision encoding in which hard decision code parity of each of the pieces of second data is generated and added;
performing LDPC encoding in which LDPC parity of the first data including the CRC parity and the hard decision code parity is generated to produce coded first data;
storing the coded first data in a NAND memory section;
reading the coded first data from the NAND memory section;
performing CRC error detection in which presence or absence of an error in each of the pieces of second data is detected from the CRC parity of each of the pieces of second data constituting the coded first data;
performing hard decision code decoding in which error correction is performed using the hard decision code parity of each of the pieces of second data constituting the coded first data;
setting a second data error flag for identifying the second data found to contain an error in the CRC error detection or the hard decision code decoding;
performing LLR change in which a reliability of the second data without the second data error flag being set is increased when the coded first data is subjected to decoding processing with the LDPC parity; and
performing the LDPC decoding processing.

10. The control method for a memory system according to claim 9, wherein
the decoding processing performed in the LDPC decoding comprises performing LDPC processing selection for selecting either one of first LDPC decoding in which an iteration process is performed using all the second data and second LDPC decoding in which an iteration process is performed without using the second data containing no error data.

11. The control method for a memory system according to claim 10, wherein
the second LDPC decoding processing is preferentially selected.

12. The control method for a memory system according to claim 11, wherein
the number of newly corrected error bits is counted in each iteration process, and based on a result of the counting, the first LDPC decoding processing is selected if the number of newly corrected error bits is less than a predetermined value.

13. The control method for a memory system according to claim 12, further comprising:
setting a second data modifier flag for identifying second data containing bit data whose code has changed in the first LDPC decoding or the second LDPC decoding;
performing second hard decision code decoding in which the hard decision code parity is used to perform error correction of second data for which the second data modifier flag and the second data error flag are set; and
resetting the second data error flag for the error-corrected second data resulting from the second hard decision code decoding.

14. The control method for a memory system according to claim 13, wherein
the reliability of the second data containing no error data is set to a maximum.

15. The control method for a memory system according to claim 9, wherein
the storing is in a memory card with the NAND memory section.

16. The control method for a memory system according to claim 9, wherein the first data is frame data and the second data is sector data.

17. A memory system having a memory card with a NAND memory section configured to store coded first data resulting from encoding first data composed of a plurality of pieces of second data and a host configured to send and receive the first data to and from the memory card, the memory card comprising:
a first ECC encoder configured to perform hard decision encoding processing with a hard decision code on a second data basis;
a second ECC encoder configured to perform LDPC encoding processing with an LDPC code on a first data basis;
a first ECC decoder configured to perform hard decision code decoding processing;
a second ECC decoder configured to perform LDPC decoding processing with the LDPC code on a first data basis;
a second data error flag section configured to store, for each second data, identification information about presence or absence of error data in the hard decision code decoding processing; and
an ECC control section configured to perform the LDPC decoding processing by setting a reliability of second data containing no error data to a maximum in the LDPC decoding processing based on the information in the second data error flag section and by preferentially selecting second LDPC decoding processing in which an iteration process is performed without using the second data containing no error data rather than first LDPC decoding processing in which an iteration process is performed using all the sector second data.

18. The memory system according to claim 17, wherein the first data is frame data and the second data is sector data.

* * * * *